May 24, 1960 E. M. DAVIES ET AL 2,937,410

METHOD OF MOLDING CAPACITORS IN PRINTED CIRCUITS

Filed Sept. 3, 1954

INVENTORS,

Edith M. Davies
Philip J. Franklin

BY

W. E. Thibodeau, A. W. Dew & J. D. Edgerton

ATTORNEYS, 2,937,410
Patented May 24, 1960

2,937,410

METHOD OF MOLDING CAPACITORS IN PRINTED CIRCUITS

Edith M. Davies and Philip J. Franklin, Washington, D.C., assignors to the United States of America as represented by the Secretary of the Army Filed Sept. 3, 1954, Ser. No. 454,239
1 Claim. (Cl. 18—59)
(Granted under Title 35, U.S. Code (1952), sec. 266)

The invention described herein may be manufactured and used by or for the Government for governmental purposes without the payment to us of any royalty thereon.

This invention relates to a method of making electrical capacitors and more particularly to electrical capacitors for use in equipment constructed by "printed circuit" techniques. A principal feature of the invention is the provision of rugged capacitors that are an integral part of a printed circuit assembly.

"Printed circuit" techniques for fabricating electrical and electronic circuitry have been used increasingly in recent years. In typical printed circuits, electrically conducing circuit patterns are produced on bases or chassis of insulating material, usually by applying silver paint through a stencil or by etching. Printed circuit techniques have several advantages, including adaptability to economical, low-cost mass production.

Various methods have been proposed or used in the past to provide capacitances needed for printed circuitry. One simple method uses alternate layers of silver paint and insulating lacquer. Sometimes two silvered electrodes painted on opposite sides of an insulating base plate provide the desired capacitance; with this method, higher capacitances can be obtained by reducing the thickness of the base plate in the region of the electrodes. When higher capacitances are desired, one usual method has been to solder into the circuit small capacitors consisting of thin ceramic wafers having silvered faces. Such capacitors, made with barium titanate or other well known ceramic dielectric materials having high dielectric constants, provide high capacitance in small space. However, the necessity of soldering these capacitors in place, and of holding them in position during the soldering operation, reduces the attractiveness of this method. Furthermore, since the capacitors are not an integral part of the printed circuit assembly but are held on by solder, they are more vulnerable to shock and vibration than are capacitors that are an integral part of the printed circuit structure. Ruggedness is particularly important in certain mobile electronic equipment that must perform with maximum reliability under severe conditions of shock and vibration.

The principal object of the present invention is to provide a method of forming compact, rugged, printed circuit capacitors that have dielectrics with high dielectric constants, that are an integral part of a printed circuit chassis and do not have to be soldered into position, that can be fabricated without raising temperatures above about 150–250° C., and that are adaptable to mechanized or partially mechanized mass production.

Briefly, capacitors in accordance with our invention are made by molding a bonded ceramic dielectric to a metallic electrode, the electrode being part of a metallic printed circuit pattern bonded to an insulating printed circuit base by well known techniques. An upper electrode, consisting preferably of metal foil, is bonded to the top surface of the dielectric. Preferred dielectrics comprise, for example, 97 parts of finely divided ceramic dielectric having a high dielectric constant and 3 parts of epoxy resin binder. We prefer to, first, apply a layer of the dielectric mixture, in powdered form, to the metallized base plate area; second, lay a metal-foil top electrode on the dielectric mixture; third, apply heat and pressure, raising the dielectric to the optimum molding temperature for the binder employed; fourth, allow the plunger to cool; and fifth, release the plunger. The result is a rugged, compact capacitor in which both the top electrode and the bottom electrode are firmly bonded to the molded dielectric, the underside of the bottom electrode being firmly bonded to the insulating base plate. The bottom electrode is already an integral part of the circuit, and electrical connection is readily made to the top electrode by applying a strip of conducting silver paint or by soldering. For higher capacitances, multilayer units can be made by stacking alternate layers of foil and dielectric and then applying heat and pressure to the entire stack. We have attained effective dielectric constants as high as 320, which is much higher than has previously been attained with painted-on or printed-on dielectrics of which we are aware.

Figure 1:
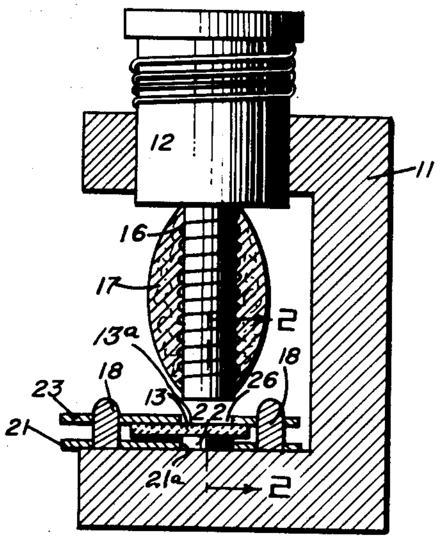
Figure 1 is a vertical section of a press adapted to mold capacitors onto a printed circuit chassis in accordance with the invention.

In Figure 1, a rigid U-shaped frame 11 has two parallel horizontal portions separated by a vertical portion. A plunger 12 of circular cross section is adapted to be moved up and down through a suitable supporting opening in the upper portion of frame 11. A ceramic chassis 13, on which the capacitor is to be molded, is supported on the lower portion of frame 11. An electrical heating element, comprising Nichrome wire 16 and asbestos insulation 17, surrounds the lower portion of plunger 12.

Positioning posts 18 are integral with frame 11. A metal base plate 21 fits over positioning posts 18 and rests on the lower portion of chassis 11. A frame rest plug 22, of circular cross section and of the same diameter as the lower portion of plunger 12 fits in an aperture 21*a*, in base plate 21. Plug 22 is coaxial with plunger 12. Ceramic chassis 13 rests on plug 22. The metallized portion 13*a* of chassis 13 to which the capacitor is to be molded rests directly beneath plunger 12. A stenciling plate 23, preferably of steel, has holes corresponding exactly to those of base plate 21 and is fitted over positioning posts 18 so that it rests on top of ceramic chassis 13 and forms a molding cavity 26 directly under plunger 12.

Figure 2:
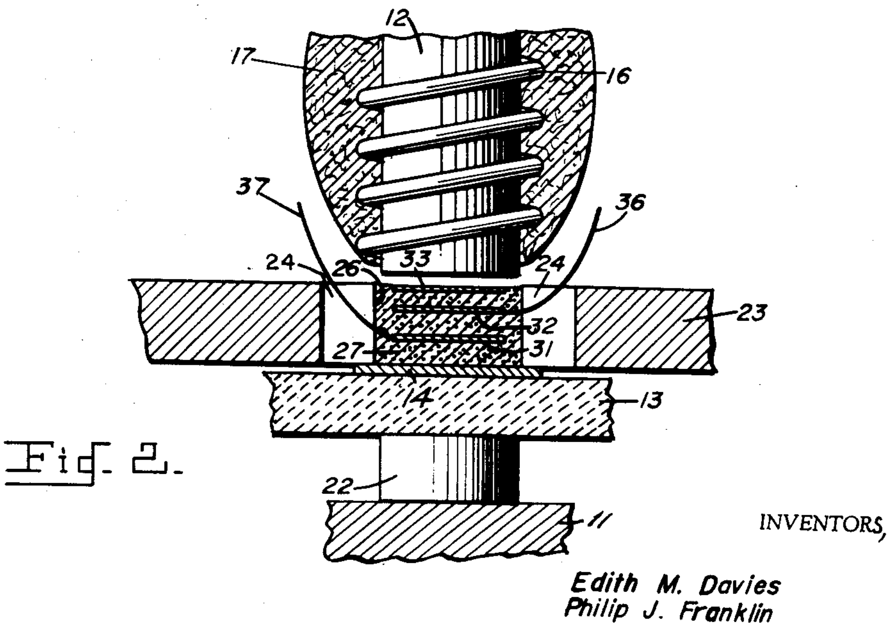
Figure 2 is an enlarged view of the molding press taken generally along line 2—2 of Figure 1 and showing the elements of a multi-layer capacitor positioned therein prior to molding.

Figure 2 shows molding cavity 26 and associated structure in greater detail. Metallic electrode 14 is bonded to ceramic chassis 13. Cavity 26 is filled alternately with layers of dielectric molding powder 27 and metal foil electrodes 31, 32, and 33. Flexible metallic leads 36 and 37 are connected to, or are extensions of, electrodes 31 and 32; these leads extend out of cavity 26 through diametrically opposed slits 24 in stenciling plate 23. The purpose of flexible leads 36 and 37 is to permit electrical connection to electrodes 31 and 32 after the molding operation has been completed.

With the dielectric powder 27 and electrodes 31—33 thus positioned in cavity 26, plunger 12 is forced downward. Preferred pressures are of the order of 15,000 to 20,000 pounds per square inch. Sufficient electric current is applied to Nichrome wire 16 to raise the temperature of powder 27 to the optimum molding temperature for the binder employed—e.g., about 150–230° C. for epoxy resins. Plunger 12 is preferably allowed to cool slightly before the pressure is released, in order to obtain good release from the molded material and to avoid deformation of the molded material after the removal of pressure. When cool, the molded material shrinks away cleanly from stenciling plate 23 but remains firmly bonded to electrodes 14, 31, 32 and 33. With plunger 12 withdrawn upward, plate 23 is lifted off and chassis 13 is removed.

Figure 3:
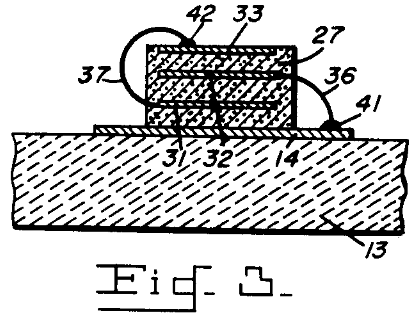
Figure 3 is a vertical section of a multi-layer capacitor in accordance with the invention.

Fig. 3 shows a multi-layer capacitor after removal from the molding press. Electrode 32 is electrically connected to bottom electrode 14 by means of flexible lead 36 and solder 41. Similarly, electrode 31 is electrically connected to top electrode 33 by means of flexible lead 37 and solder 42. Electrode 33 can be connected to the desired portion of the circuit by soldering or by painting on a strip of conducting metallic paint.

Figure 4:
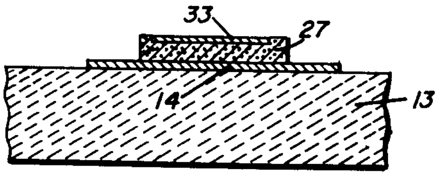
Figure 4 is a vertical section of a single-layer capacitor in accordance with the invention.

It will be apparent that single-layer capacitors can be readily made by the same techniques described for multi-layer capacitors. Fig. 4 shows such a single layer capacitor. A piece of metal foil 33 placed on top of the dielectric powder prior to molding becomes firmly bonded to dielectric 27 and serves as the top electrode. Alternatively, dielectric 27 can be molded onto electrode 14 without metal foil 33, and air-drying silver paint can be applied to the top of dielectric 27 after molding to provide a top electrode. However, we have found that this latter-described method of providing the top electrode does not provide as high values of capacitance—i.e., of effective dielectric constant—as does the first-described method.

Our best results to date have been obtained when dielectric 27 was made with a commercially available ceramic having the following composition by weight:

| | |
|---|---|
| $BaTiO_3$ | 87.0 |
| $BaZrO_3$ | 10.4 |
| $MgZrO_3$ | 2.6 |
| $MnO_2$ | 0.25 |

Ninety-seven parts of the ceramic, ground and screened through a 200-mesh screen, were mixed with three parts of an epoxy resin having a viscosity of 12,400 centipoises, an epoxy value of 0.52 (equivalent per 100 grams), and a specific gravity of 1.1676. These materials were mixed with the addition of a small amount of solvent, preferably acetone, to facilitate uniform distribution of the resin. A catalyst consisting of boron trifluoride piperidine complex was added during the mixing, in the proportion of between 7 and 30 parts to 100 parts of the epoxy resin. Single-layer capacitors were molded from this mixture in the manner described, using a pressure of 23,500 pounds per square inch and maintaining the temperature at about 230° C. for 5 minutes. These capacitors had the following characteristics:

| | |
|---|---|
| Diameter of dielectric | 0.25 in. |
| Thickness of dielectric | 0.0054 in. |
| Capacitance | 0.00071 mfd. |
| Dielectric constant | 320 |
| Insulation resistance (product of megohms × microfarads, above 14) | above 20,000 megohms. |
| Dielectric breakdown | approx. 1100 volts. (200 volts/mil). |

In temperature tests over the range between −50° C. and 100° C., capacitance varied between −11 percent and 6 percent of room temperature values. In frequency tests over the range $10^2$ to $10^5$ cycles, the maximum change in dielectric constant was about 5 percent.

It will be apparent that dielectric 27 can be made from various finely divided ceramic dielectric materials in combination with various binders adapted to being thermally molded. We have found that ceramics that have the highest dielectric constants in solid form also tend to give the highest dielectric constants when incorporated in our capacitors. To obtain the highest dielectric constant in the final dielectric material, only enough binder should be used to completely fill the interstices around the ceramic particles, leaving no voids; we have found that, with the binders we have used, about 3 percent by weight of binder gives best results.

The epoxy resin binders that we have used in most of our work to date are thermosetting plastics, but it will be apparent that other binders adapted to being thermally molded—various thermoplastic materials and certain waxes, for example—can be used. With the thermosetting binders, proper molding requires that heat and pressure be applied long enough for the binder to cure; about 4 or 5 minutes has been found satisfactory with epoxy resins in typical cases. With other binders, the necessary pressure need be accompanied by heat only long enough to melt or sufficiently soften the binder, which can then immediately be allowed to cool and harden.

The epoxy resins we have used have dielectric constants of about 3 to 4. It seems reasonable to suppose that binders having higher dielectric constants will be found to give dielectric mixtures having higher final dielectric constants after molding. Lanosterol (a wool-wax triterpene), for example, has a dielectric constant of about 12; we consider lanosterol to be one of the promising binders for use in accordance with our invention.

In addition to providing ruggedness and compactness, it will be understood that the invention offers particular advantages for mechanized mass production, with attendant reduced costs of fabrication and of inspection and improved uniformity of product. It is to be noted that the molding temperatures are low or moderate and, in the preferred method of fabrication, are localized; this means that our capacitors can be applied to a ceramic chassis after other components—printed resistors, for example—have been positioned, without any adverse thermal effects on the remainder of the printed circuitry.

It will be apparent that the embodiments shown are only exemplary and that various modifications can be made in construction and arrangement within the scope of the invention as defined in the appended claim.

We claim:

The method of fabricating a highly miniaturized molded capacitor in situ as a component of a printed circuit on an insulating chassis, comprising the steps of: positioning a stencil having a hole therein so that said hole is directly over a discrete portion of said printed circuit, said discrete portion serving as an electrode of said miniaturized capacitor; placing within said hole and upon said discrete portion a stacked arrangement of metallic plates with layers of a dry dielectric and binder mixture therebetween such that a layer of said mixture contacts said discrete portion; raising the temperature of said stacked arrangement while applying a pressure thereto; and lowering the temperature of said stacked arrangement until said mixture is firmly molded and securely bonded to said electrode and each of said metallic plates.

References Cited in the file of this patent

UNITED STATES PATENTS

| | | |
|---|---|---|
| 1,745,400 | Brennecke | Feb. 4, 1930 |
| 1,871,492 | Brennecke | Aug. 16, 1932 |
| 2,436,208 | Dressel | Feb. 17, 1948 |
| 2,444,473 | Skinker et al. | July 6, 1948 |
| 2,527,373 | Parson | Oct. 24, 1950 |
| 2,577,005 | Di Giacomo | Dec. 4, 1951 |
| 2,611,040 | Brunetti | Sept. 16, 1952 |
| 2,682,024 | Kohman | June 22, 1954 |
| 2,695,443 | Wagner | Nov. 30, 1954 |
| 2,697,253 | Kruft | Dec. 21, 1954 |
| 2,706,798 | Kodama | Apr. 19, 1955 |
| 2,766,482 | Heibel | Oct. 16, 1956 |

FOREIGN PATENTS

| | | |
|---|---|---|
| 691,240 | Great Britain | May 6, 1953 |
| 706,067 | Great Britain | Mar. 24, 1954 |